(12) United States Patent
Cheng et al.

(10) Patent No.: US 7,247,575 B2
(45) Date of Patent: Jul. 24, 2007

(54) MULTI-STEP EBR PROCESS FOR PHOTORESIST REMOVAL

(75) Inventors: Chiu Sung Cheng, Jhubei (TW); Wu Ming Che, Chiayi (TW); Hung Shih Lei, Kaohsiung (TW); Huang Ching Juinn, Shanhua Township, Tainan County (TW)

(73) Assignee: Taiwan Semiconductor Manufacturing Co., Ltd.

( * ) Notice: Subject to any disclaimer, the term of this patent is extended or adjusted under 35 U.S.C. 154(b) by 244 days.

(21) Appl. No.: 10/881,340

(22) Filed: Jun. 30, 2004

(65) Prior Publication Data

US 2006/0003591 A1    Jan. 5, 2006

(51) Int. Cl.
*H01L 21/302* (2006.01)
*H01L 21/461* (2006.01)

(52) U.S. Cl. ........................... 438/730; 438/707
(58) Field of Classification Search ................ 438/707, 438/710, 730, 748, 782
See application file for complete search history.

(56) References Cited

U.S. PATENT DOCUMENTS

| | | | |
|---|---|---|---|
| 4,839,311 A * | 6/1989 | Riley et al. | 438/14 |
| 5,783,097 A * | 7/1998 | Lo et al. | 216/41 |
| 2004/0126923 A1* | 7/2004 | Benson | 438/58 |

\* cited by examiner

*Primary Examiner*—Phuc T. Dang
(74) *Attorney, Agent, or Firm*—Tung & Associates

(57) ABSTRACT

An edge bead removal process is disclosed. The process includes providing a wafer having a feature layer, coating a photoresist on the feature layer, rotating the wafer, and removing an edge bead from the wafer by removing an edge bump portion from the edge bead and removing an edge region from the edge bead.

20 Claims, 5 Drawing Sheets

MULTI-STEP EBR PROCESS FOR PHOTORESIST REMOVAL

FIELD OF THE INVENTION

The present invention relates to photolithography processes used to pattern integrated circuit devices on semiconductor wafers. More particularly, the present invention relates to a two-step edge bead removal (EBR) process for removing beaded photoresist from the edge of a wafer during coating of a photoresist on the wafer.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

The photolithography step of semiconductor production is a complex process which can generally be divided into an eight-step procedure including vapor prime, in which the surface of the wafer substrate is cleaned, dehydrated and primed to promote adhesion between the photoresist material and the substrate surface; spin coating, in which a quantity of liquid photoresist is applied to the substrate either before or during rotation of the substrate; soft bake, in which most of the solvent in the resist is driven off by heating the substrate; alignment and exposure, in which a mask or reticle corresponding to the desired circuit pattern is aligned to the correct location on the substrate and light energy is applied through the mask or reticle onto the photoresist to define circuit patterns which will be etched in a subsequent processing step to define the circuits on the substrate; post-exposure bake; develop, in which the soluble areas of photoresist are dissolved by liquid developer, leaving visible islands and windows corresponding to the circuit pattern on the substrate surface; hard bake, in which the remaining photoresist solvent is evaporated from the substrate; and develop inspect, in which an inspection is carried out in order to verify the quality of the resist pattern.

Resists which are determined by development inspection to be defective can be removed through resist stripping for re-processing of the substrate. Those resists which are determined not to be defective are subjected to etching, in which those areas of a conductive layer on the substrate not covered by the photoresist are etched and those areas covered by the photoresist are protected, leaving the circuit pattern in the conductive layer on the substrate. Alternatively, the photoresist may cover an electrically-insulating dielectric layer, in which case the areas of the dielectric layer not covered by the photoresist are etched and those areas covered by the photoresist are protected, leaving the circuit pattern etched in the form of vias, trenches, or both vias and trenches in the dielectric layer. The vias and/or trenches are then filled with metal in a deposition process to form the circuit pattern.

Spin coating of photoresist on wafers is carried out in an automated track system using wafer handling equipment which transport the wafers between the various photolithography operation stations, such as vapor prime resist spin coat, develop, baking and chilling stations. Robotic handling of the wafers minimizes particle generation and wafer damage. Automated wafer tracks enable various processing operations to be carried out simultaneously. Two types of automated track systems widely used in the industry are the TEL (Tokyo Electron Limited) track and the SVG (Silicon Valley Group) track.

Photoresist materials are coated onto the surface of a wafer by dispensing a photoresist fluid typically on the center of the wafer as the wafer rotates at high speeds within a stationary bowl or coater cup. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

In addition to photolithography, photoresist is often used as a sacrificial layer in etchback processes, such as copper etchback processes, in which topography created by surface features on the wafer is smoothed using an etching process. The sacrificial photoresist layer is deposited on the wafer and fills voids and low spots on the surface features. Dry etching of the photoresist layer is then carried out to smooth the surface features by removing high features at a faster rate than low features. The etching process is continued until the photoresist layer reaches a final thickness, with the photoresist material still filling the low-lying areas.

FIG. 1A illustrates a wafer 10 having deposited thereon a feature layer 12 having surface features (not shown) to be reduced in size in an etchback process. Accordingly, as the wafer 10 is rotated on a wafer support (not shown), liquid photoresist 14 is initially deposited from a photoresist dispenser 16 onto the feature layer 12 at the center of the wafer 10. The photoresist 14 will serve as a sacrificial layer during the subsequent etchback process.

As shown in FIG. 1B, the rotating motion of the wafer 10 causes centrifugal force to pull the photoresist 14 to the edge of the wafer 10. This causes the formation of an edge bead 17 which includes an annular edge bump 18, having an edge region 20, at the edge of the wafer 10 and layer 12.

As shown in FIG. 1C, prior to the etchback process, the edge region 20 of the edge bump 18 is removed in a one-step edge bead removal (EBR) process carried out at the end of the photoresist-coating step. The EBR process is typically performed by spraying a small quantity of solvent (not shown) on the underside of the wafer 10 as the wafer 10 is rotated. The solvent laps up over the edge of the wafer 10, thus dissolving and removing the edge region 20 from the edge bump 18. Accordingly, a reduced edge bump 18a, having a reduced height as compared to that of the edge bump 18, remains at the edge of the wafer 10 after the EBR step.

The wafer 10 is then subjected to the etchback process, in which dry etching is used to reduce the size of features fabricated in the feature layer 12. After the etchback process, as shown in FIG. 1D, a small quantity of photoresist 14 remains on the wafer 10 in the form of edge bump remnants 18b. These edge bump remnants 18b are a significant source of contaminant particles, which flake off and tend to contaminate active devices subsequently fabricated in and on the feature layer 12, thereby increasing defect densities of devices on the wafer 10. Accordingly, an edge bead removal method is needed for the complete removal of an edge bead from a wafer, particularly prior to an etchback process.

An object of the present invention is to provide a novel method which is capable of decreasing defect densities in devices fabricated on a wafer.

Another object of the present invention is to provide a novel multi-step edge bead removal (EBR) process for the substantially complete removal of an edge bead from a wafer.

Still another object of the present invention is to provide a multi-step EBR process which is effective in removing an edge bead from a wafer prior to an etchback or other process.

Yet another object of the present invention is to provide a novel EBR process which may include the removal of an edge bump portion from an edge bead, followed by the removal of an edge region from the edge bead, to prevent or at least minimize the formation of potential device-contaminating particles during a subsequent etchback process.

SUMMARY OF THE INVENTION

In accordance with these and other objects and advantages, the present invention is generally directed to a novel multi-step EBR process for the substantially complete removal of an edge bead from a wafer, such as prior to an etchback process, for example. The multi-step EBR process includes depositing a photoresist layer on a wafer; rotating the wafer, wherein an annular edge bead forms at the wafer edge; removing an edge bump portion from the edge bead; and removing an edge region from the remaining portion of the edge bead. After completion of an etchback process, the wafer is substantially devoid of residual photoresist which otherwise could contaminate active regions of devices fabricated on the wafer.

BRIEF DESCRIPTION OF THE DRAWINGS

The invention will now be described, by way of example, with reference to the accompanying drawings, in which.

DETAILED DESCRIPTION OF THE INVENTION

Figure 1A:
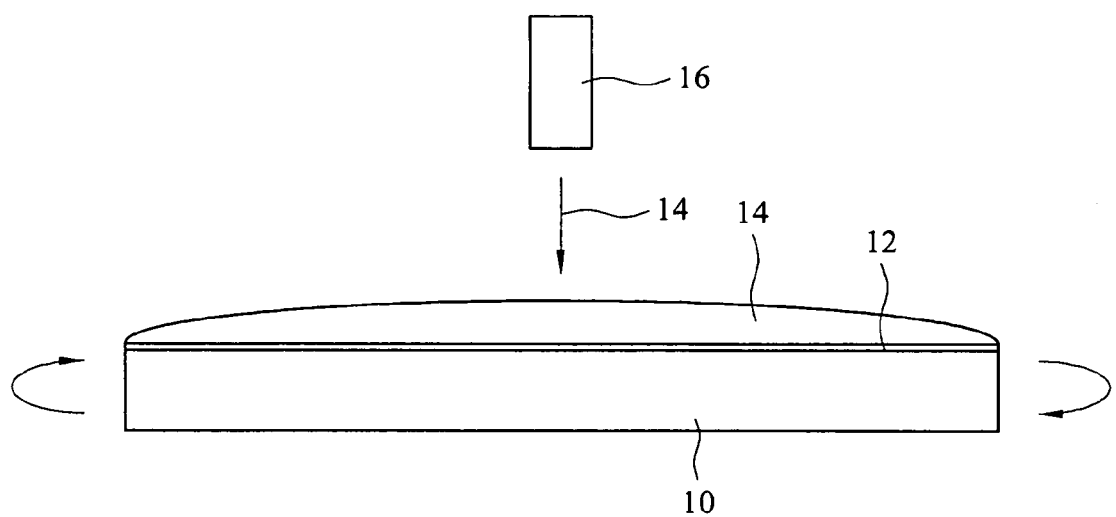
FIG. 1A is a cross-sectional view of a wafer, illustrating a conventional process for coating a liquid photoresist on the wafer.
Figure 1B:
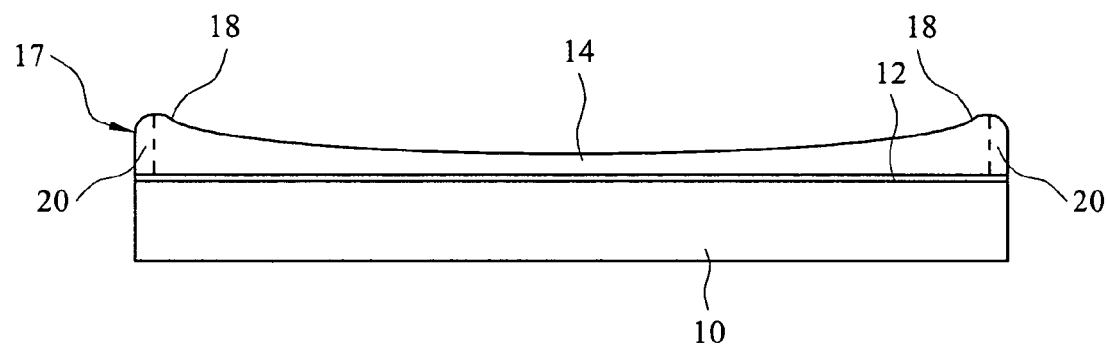
FIG. 1B is a cross-section of the wafer of FIG. 1A, illustrating the formation of an edge bead at the edge of the wafer during the conventional photoresist-coating process of FIG. 1A.
Figure 1C:
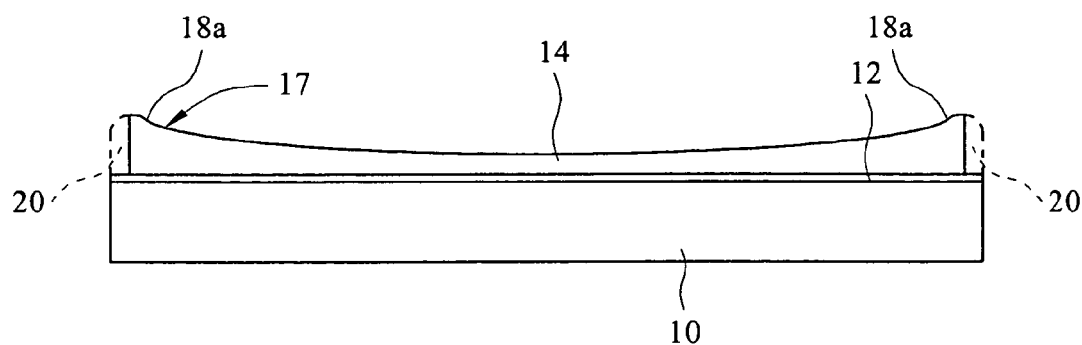
FIG. 1C is a cross-sectional view of the wafer, illustrating removal of an edge region from the edge bead according to a conventional edge bead removal process.
Figure 1D:
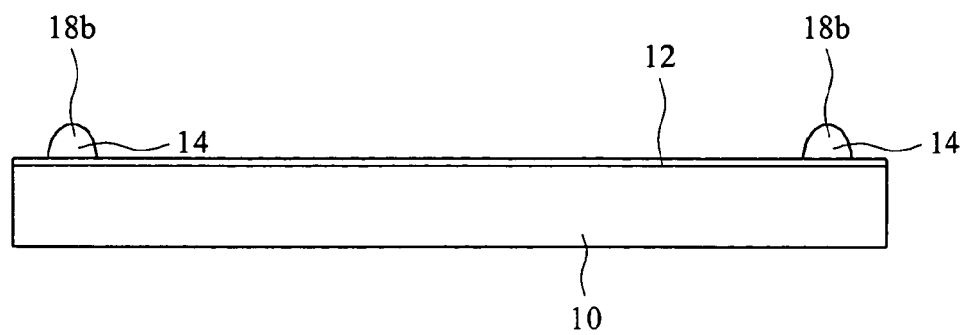
FIG. 1D is a cross-section of the wafer after completion of an etchback process, wherein residual photoresist remains on the wafer.
Figure 2A:
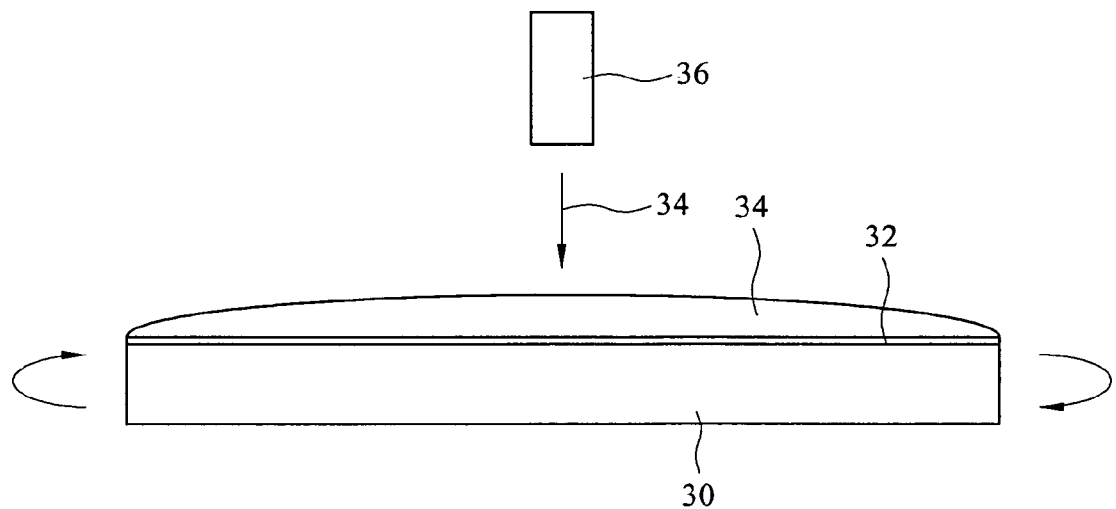
FIG. 2A is a cross-section of a wafer, illustrating coating of a liquid photoresist on the wafer as a first step according to the process of the present invention.

Referring initially to FIGS. 2A–2E, a multi-step EBR process carried out according to the process of the present invention is shown. As illustrated in FIG. 2A, a wafer 30 having a feature layer 32 deposited thereon is initially provided. The feature layer 32 may include, for example, copper plugs (not shown) which establish electrical communication between metal lines or layers separated by a dielectric layer. The feature layer 32 typically includes features which require planarization and/or height reduction, for example. The planarization and/or height reduction of the features in the feature layer 32 will be carried out in a subsequent etchback process, which may be conventional and will be hereinafter described.

Figure 2B:
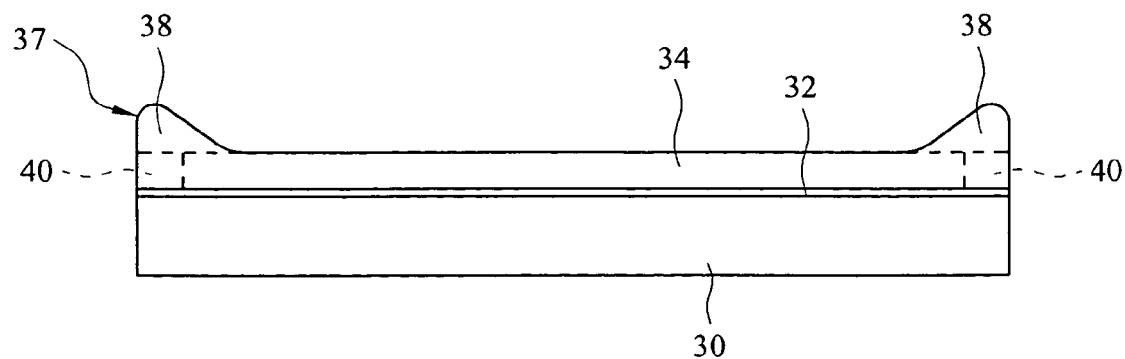
FIG. 2B is a cross-section of the wafer, illustrating formation of an edge bead on the wafer during the photoresist-coating step of FIG. 2A.

As shown in FIG. 2A, a liquid photoresist 34 is coated on the feature layer 32 as the wafer 30 is rotated. The photoresist-coating step may be carried out in a conventional coater cup (not shown) using process parameters and techniques known to those skilled in the art. During the photoresist-coating step, a photoresist dispenser 36 deposits the liquid photoresist 34 on the feature layer 32 at substantially the center of the wafer 30. Centrifugal force generated by the rotating wafer 30 pulls the photoresist 34 outwardly from the center to the edges of the wafer 30, forming an annular edge bead 37 at the circumferential edge of the wafer 30, as shown in FIG. 2B. For purposes of the present invention, the edge bead 37 includes an edge bump portion 38 which extends upwardly beyond the plane of the photoresist 34 and an edge region 40 which includes the annular outer region of the photoresist 34, beneath the edge bump portion 38.

Figure 2C:
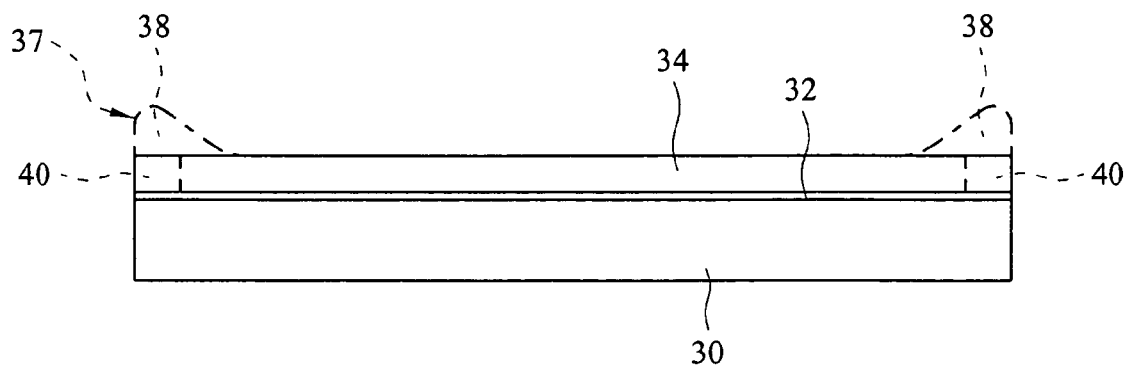
FIG. 2C is a cross-section of the wafer after removal of the edge bump portion of the edge bead according to the process of the present invention.
Figure 3A:
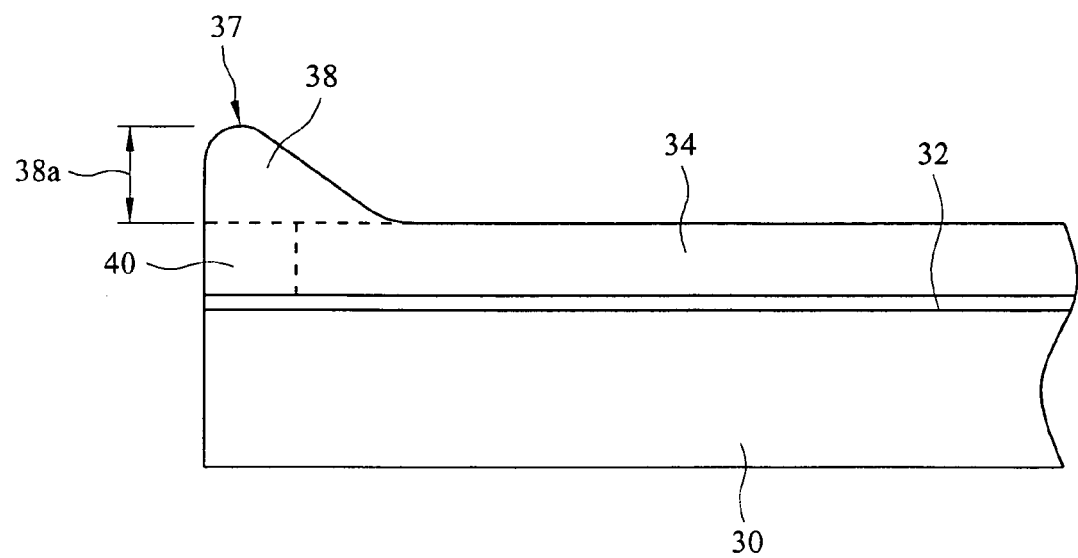
FIG. 3A is an enlarged, partial cross-section of the wafer, illustrating removal of the edge bump portion from the edge bead according to the process of the present invention.

After completion of the photoresist-coating step, the edge bump portion 38 is initially removed from the edge bead 37 in a first step of a multi-step edge bead removal process according to the present invention, as shown in FIG. 2C. This edge bead removal step may be carried out in a conventional coater cup (not shown) using conventional EBR equipment. A common approach involves the use of a spray nozzle assembly (not shown) to spray solvent on the edge bump portion 38, thus dissolving the photoresist in the edge bump portion 38. Typical solvents which may be used to remove the edge bump portion 38 include propylene glycol monomethyl ether acetate (PGMEA) or ethylene glycol monomethyl ether acetate (EGMEA), for example. As shown in FIG. 3A, the bump portion height 38a of the edge bump portion 38 removed from the edge bead 37 is typically about 1.8 mm. After removal of the edge bump portion 38, the photoresist 34 has a substantially uniform thickness across the surface of the feature layer 32, as shown by the solid line in FIG. 2C.

Figure 2D:
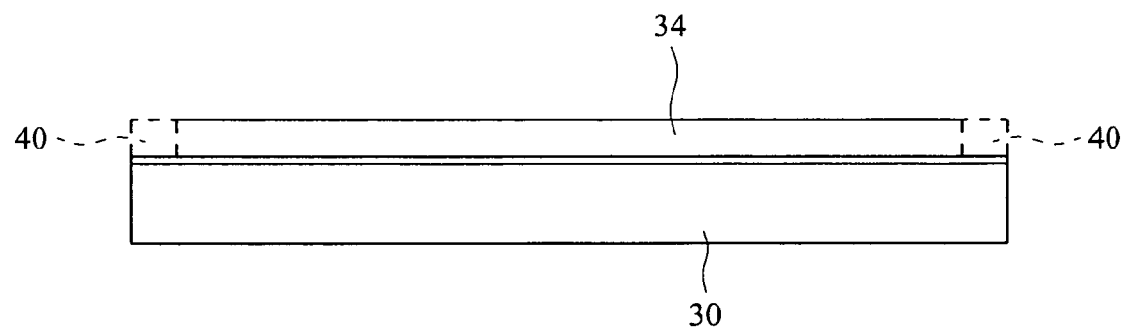
FIG. 2D is a cross-section of the wafer after removal of an edge region of the edge bead according to the process of the present invention.
Figure 3B:
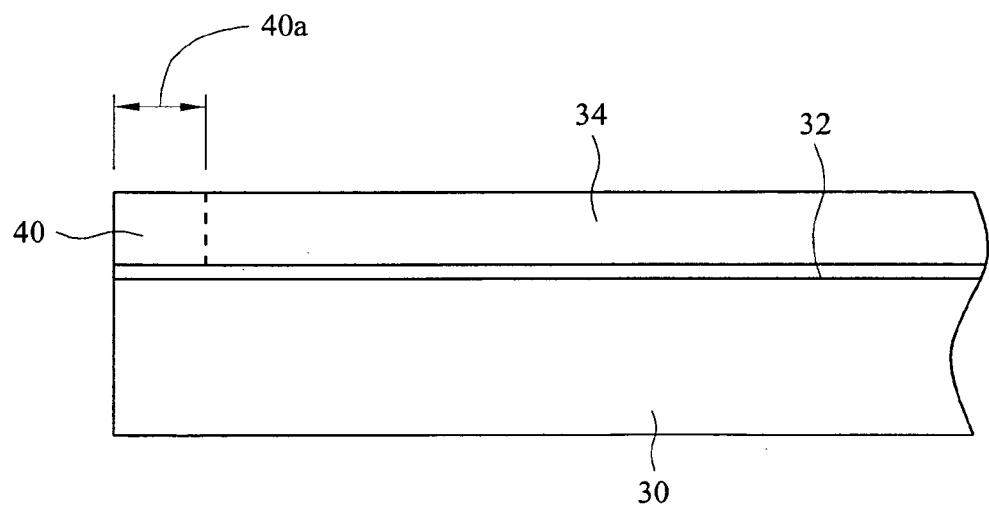
FIG. 3B is an enlarged, partial cross-section of the wafer, illustrating removal of the edge region of the edge bead according to the process of the present invention.

As shown in FIG. 2D, after removal of the edge bump portion 38, the edge region 40 is removed from the remaining portion of the edge bead 37 in a second step of an edge bead removal process according to the present invention. This edge bead removal step may be carried out in a conventional coater cup (not shown) using conventional EBR equipment, typically using a solvent which is sprayed onto the bottom of the wafer 30, laps over the wafer edge and contacts the edge region 40 of the photoresist 34 to dissolve the photoresist 34. As shown in FIG. 3B, this step removes from the photoresist 34 an edge region 40 having an edge region width 40a of typically about 1.0 mm.

After removal of the photoresist 34 from the edge region 40, the feature layer 32 is subjected to an etchback process in order to planarize or reduce the height of device features (not shown) in the feature layer 32. The etchback process may be conventional and is typically carried out in a dry etcher (not shown). The etchback process typically involves etching of the photoresist 34 as the sacrificial layer, to reduce and/or planarize the surface features as the high features are removed at a faster rate than the low features. This process is continued until the photoresist 34 reaches a final thickness, with the photoresist 34 still filling the low-lying areas of the features in the feature layer 32.

Figure 2E:
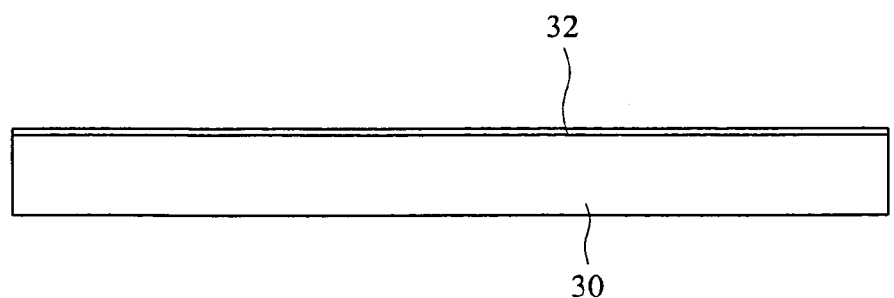
FIG. 2E is a cross-section of the wafer after an etchback process.

As shown in FIG. 2E, after completion of the etchback process, the edge bead 37 is no longer present on the wafer 10. This prevents or minimizes the formation of potential device-contaminating particles from flaking off of the edge bead 37 and contaminating the active regions of the devices during subsequent fabrication processing, in which the fabrication of integrated circuit devices on the wafer 10 is completed according to techniques known by those skilled in the art. Accordingly, the defect count of the devices fabricated on the wafer 10 is substantially reduced, while the yield of devices fabricated on the wafer 10 is substantially enhanced.

Figure 4:
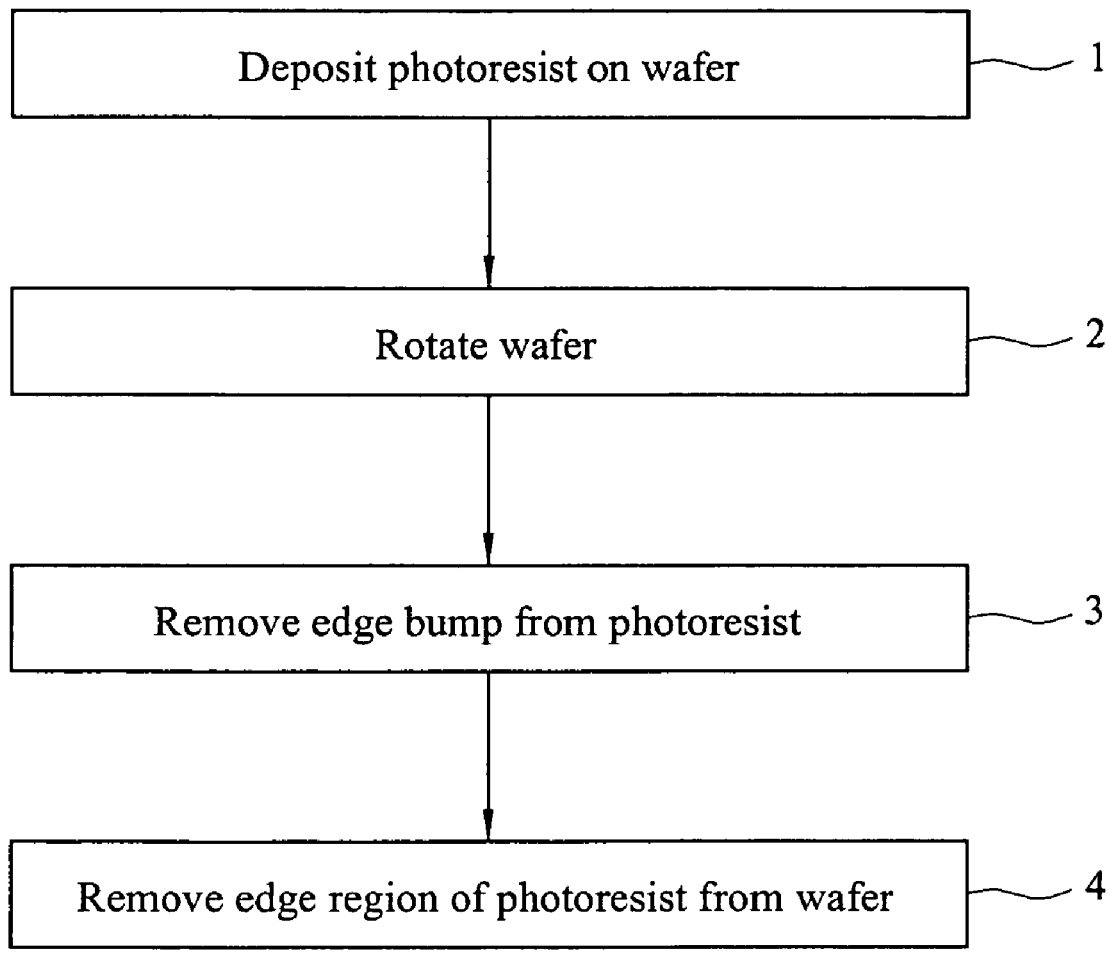
FIG. 4 is a flow diagram which summarizes sequential process steps carried out according to the process of the present invention.

The flow diagram of FIG. 4 summarizes a typical flow of process steps carried out according to the process of the present invention. In step 1, a liquid photoresist is coated over device features on a wafer. In step 2, the wafer is rotated to uniformly spread the photoresist over the wafer. The wafer is typically rotated as the photoresist is dispensed onto the wafer. Due to the action of centrifugal force, step 2 results in the formation of an annular edge bead formed by the photoresist at the edge of the wafer. In step 3, the edge bump portion is removed from the edge bead in a first stage of an edge bead removal process. In step 4, the edge region of the photoresist is removed from the remaining portion of the edge bead to complete removal of the edge bead from the wafer. Following step 5, the fabrication of devices on the wafer is completed according to the knowledge of those skilled in the art. This typically includes subjecting the wafer to an etchback process in order to planarize and/or reduce the height of the device features on the wafer.

While the preferred embodiments of the invention have been described above, it will be recognized and understood that various modifications can be made in the invention and the appended claims are intended to cover all such modifications which may fall within the spirit and scope of the invention.

What is claimed is:

1. An edge bead removal process, comprising:
   providing a wafer having a feature layer;
   coating a photoresist on said feature layer;
   rotating said wafer, whereby an edge bead comprising said photoresist forms on said feature layer;
   removing an edge bump portion comprising said edge bead; and
   removing an edge region thickness underlying said edge bump portion comprising said edge bead to expose said feature layer following removing said edge bump portion.

2. The process of claim 1 wherein said edge bump portion has a bump portion height of about 1.8 mm.

3. The process of claim 1 wherein said edge region has an edge region width of about 1.0 mm.

4. The process of claim 3 wherein said edge bump portion has a bump portion height of about 1.8 mm.

5. The process of claim 1 further comprising subjecting said feature layer to an etchback process.

6. The process of claim 5 wherein said edge bump portion has a bump portion height of about 1.8 mm.

7. The process of claim 5 wherein said edge region has an edge region width of about 1.0 mm.

8. The process of claim 7 wherein said edge bump portion has a bump portion height of about 1.8 mm.

9. A process for reducing defects and enhancing yield of devices on a wafer, comprising:
   providing a wafer having a feature layer;
   coating a photoresist on said feature layer;
   rotating said wafer, whereby an edge bead comprising said photoresist forms on said feature layer;
   removing an edge bump portion extending above an upper plane of said photoresist overlying an edge region thickness comprising said edge bead;
   removing said edge region thickness to expose said feature layer following removing said edge bump portion; and
   completing fabrication of devices on said wafer.

10. The process of claim 9 wherein said edge bump portion has a bump portion height of about 1.8 mm.

11. The process of claim 9 wherein said edge region has an edge region width of about 1.0 mm.

12. The process of claim 11 wherein said edge bump portion has a bump portion height of about 1.8 mm.

13. The process of claim 9 wherein said completing fabrication of devices on said wafer comprises subjecting said feature layer to an etchback process.

14. The process of claim 13 wherein said edge bump portion has a bump portion height of about 1.8 mm.

15. The process of claim 13 wherein said edge region has an edge region width of about 1.0 mm.

16. The process of claim 15 wherein said edge bump portion has a bump portion height of about 1.8 mm.

17. An edge bead removal process, comprising:
providing a wafer having a feature layer;
coating a photoresist on said feature layer;
rotating said wafer, whereby an edge bead comprising said photoresist forms on said feature layer;
imparting a generally planar configuration to said photoresist by removing an edge bump portion extending above an upper plane of said photoresist, said edge bump portion overlying an edge region thickness comprising said edge bead; and
removing said edge region thickness to expose said feature layer following removal of said edge bump portion.

18. The process of claim 17 wherein said steps of imparting a generally planar configuration to said photoresist and removing said edge region comprises applying a solvent to said edge bead.

19. The process of claim 17 further comprising subjecting said feature layer to an etchback process.

20. The process of claim 17 wherein said step of imparting a generally planar configuration to said photoresist comprises applying a first solvent to said edge bead and said step of removing said edge region comprises applying a second solvent to said edge region by applying said second solvent to a bottom of said wafer.

* * * * *